United States Patent
Hart et al.

(10) Patent No.: US 11,621,386 B2
(45) Date of Patent: Apr. 4, 2023

(54) GATE VOLTAGE-TUNABLE ELECTRON SYSTEM INTEGRATED WITH SUPERCONDUCTING RESONATOR FOR QUANTUM COMPUTING DEVICE

(71) Applicant: International Business Machines Corporation, Armonk, NY (US)

(72) Inventors: Sean Hart, Tarrytown, NY (US); Jay M. Gambetta, Yorktown Heights, NY (US); Patryk Gumann, Tarrytown, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 382 days.

(21) Appl. No.: 16/373,096

(22) Filed: Apr. 2, 2019

(65) Prior Publication Data

US 2020/0321508 A1     Oct. 8, 2020

(51) Int. Cl.
| | |
|---|---|
| *H01L 39/22* | (2006.01) |
| *H01L 29/15* | (2006.01) |
| *H01L 29/16* | (2006.01) |
| *H01L 29/165* | (2006.01) |
| *H01L 29/205* | (2006.01) |

(Continued)

(52) U.S. Cl.
CPC .......... *H01L 39/223* (2013.01); *H01L 29/155* (2013.01); *H01L 29/165* (2013.01); *H01L 29/1606* (2013.01); *H01L 29/205* (2013.01); *H01L 29/437* (2013.01);

(Continued)

(58) Field of Classification Search
CPC ... H01L 39/223; H01L 39/228; H01L 29/437; H01L 39/025; H01L 39/2493
See application file for complete search history.

(56) References Cited

U.S. PATENT DOCUMENTS 5,138,401 A * 8/1992 Yamazaki ..................... 357/5
6,597,010 B2    7/2003 Eriksson et al.
(Continued)

FOREIGN PATENT DOCUMENTS

WO     2004070735 A1     8/2004

OTHER PUBLICATIONS

L. Casparis, et al., Superconducting Gatemon Qubit based on a Proximitized Two-Dimensional Electron Gas, Dec. 8, 2017.

(Continued)

*Primary Examiner* — Tucker J Wright
(74) *Attorney, Agent, or Firm* — Garg Law Firm, PLLC; Rakesh Garg; Erik Johnson

(57) ABSTRACT

A superconducting coupling device includes a resonator structure. The resonator structure has a first end configured to be coupled to a first device and a second end configured to be coupled to a second device. The device further includes an electron system coupled to the resonator structure, and a gate positioned proximal to a portion of the electron system. The electron system and the gate are configured to interrupt the resonator structure at one or more predetermined locations forming a switch. The gate is configured to receive a gate voltage and vary an inductance of the electron system based upon the gate voltage. The varying of the inductance induces the resonator structure to vary a strength of coupling between the first device and the second device.

23 Claims, 11 Drawing Sheets

(51) Int. Cl.
*H01L 29/43* (2006.01)
*H01L 39/02* (2006.01)
*H01L 39/24* (2006.01)

(52) U.S. Cl.
CPC .......... *H01L 39/025* (2013.01); *H01L 39/228* (2013.01); *H01L 39/2493* (2013.01)

(56) References Cited

U.S. PATENT DOCUMENTS

| | | |
|---|---|---|
| 9,126,829 B2 | 9/2015 | Wu |
| 9,379,303 B2 | 6/2016 | Gambetta et al. |
| 9,691,033 B2 | 6/2017 | Rogge et al. |
| 2016/0104073 A1* | 4/2016 | Sandberg .............. H01L 39/223 257/32 |
| 2017/0116542 A1 | 4/2017 | Shim et al. |
| 2017/0133576 A1 | 5/2017 | Marcus et al. |
| 2017/0212860 A1 | 7/2017 | Naaman et al. |
| 2017/0308804 A1 | 10/2017 | Wabnig et al. |

OTHER PUBLICATIONS

Jay M. Gambetta et al., Building logical qubits in a superconducting quantum computing system, Quantum Information 2017.
R.C. Bialczak et al., Quantum process tomography of a universal entangling gate implemented with Josephson phase qubits, Nature Physics, Apr. 25, 2010.
A. Dewes et al., Characterization of a Two-Transmon Processor with Individual Single-Shot Qubit Readout, Physical Review Letters, Feb. 3, 2012.
R. Barends et al., Superconducting quantum circuits at the surface code threshold for fault tolerance, Nature, Apr. 24, 2014.
L. Dicarlo et al., Demonstration of two-qubit algorithms with a superconducting quantum processor, Nature, Jul. 9, 2009.
Jerry Moy Chow, Quantum Information Processing with Superconducting Qubits, May 2010.
Zhenyi Qi, et al., Controlled-Z gate for transmon qubits coupled by semiconductor juctions, Physical Review, Apr. 23, 2018.
Lee, et al., Transport studies of epi-Al/InAs 2DEG systems for required building-blocks in topological superconductor networks, 2017.
M.T. Allen, et al., Observation of Electron Coherence and Fabry—Perot Standing Waves at a Graphene Edge, Oct. 18, 2017.
Morpurgo et al., "Hot electron tunable supercurrent", Applied Physics Letters, A I P Publishing LLC, US, vol. 72, No. 8, Feb. 23, 1998.
Pechal et al., "Superconducting switch for fast on-chip routing of quantum microwave fields", arxiv.org, Cornell University Library, 201 Olin Library Cornell University Ithaca, NY, Jun. 3, 2016.
International Searching Authority, PCT/EP2020/057412, dated Jun. 19, 2020.
Application No. 2021-7030845, OA1, Aug. 18, 2022.
Application No. 2021-7030845, OA1 English Translation, Aug. 18, 2022.
Application No. 2020250769, Examination report No. 1 for standard patent application, dated Aug. 22, 2022.

* cited by examiner

GATE VOLTAGE-TUNABLE ELECTRON SYSTEM INTEGRATED WITH SUPERCONDUCTING RESONATOR FOR QUANTUM COMPUTING DEVICE

TECHNICAL FIELD

The present invention relates generally to a superconductor device, a fabrication method, and fabrication system for controlling qubit coupling in superconducting quantum devices. More particularly, the present invention relates to a device, method, and system for a gate voltage-tunable electron system integrated with a superconducting resonator for a quantum computing device.

BACKGROUND

Hereinafter, a "Q" prefix in a word or phrase is indicative of a reference of that word or phrase in a quantum computing context unless expressly distinguished where used.

Molecules and subatomic particles follow the laws of quantum mechanics, a branch of physics that explores how the physical world works at the most fundamental levels. At this level, particles behave in strange ways, taking on more than one state at the same time, and interacting with other particles that are very far away. Quantum computing harnesses these quantum phenomena to process information.

The computers we use today are known as classical computers (also referred to herein as "conventional" computers or conventional nodes, or "CN"). A conventional computer uses a conventional processor fabricated using semiconductor materials and technology, a semiconductor memory, and a magnetic or solid-state storage device, in what is known as a Von Neumann architecture. Particularly, the processors in conventional computers are binary processors, i.e., operating on binary data represented in 1 and 0.

A quantum processor (q-processor) uses the odd nature of entangled qubit devices (compactly referred to herein as "qubit," plural "qubits") to perform computational tasks. In the particular realms where quantum mechanics operates, particles of matter can exist in multiple states—such as an "on" state, an "off" state, and both "on" and "off" states simultaneously. Where binary computing using semiconductor processors is limited to using just the on and off states (equivalent to 1 and 0 in binary code), a quantum processor harnesses these quantum states of matter to output signals that are usable in data computing.

Conventional computers encode information in bits. Each bit can take the value of 1 or 0. These 1s and 0s act as on/off switches that ultimately drive computer functions. Quantum computers, on the other hand, are based on qubits, which operate according to two key principles of quantum physics: superposition and entanglement. Superposition means that each qubit can represent both a 1 and a 0 at the same time. Entanglement means that qubits in a superposition can be correlated with each other in a non-classical way; that is, the state of one (whether it is a 1 or a 0 or both) can depend on the state of another, and that there is more information that can be ascertained about the two qubits when they are entangled than when they are treated individually.

Using these two principles, qubits operate as more sophisticated processors of information, enabling quantum computers to function in ways that allow them to solve difficult problems that are intractable using conventional computers. IBM has successfully constructed and demonstrated the operability of a quantum processor using superconducting qubits (IBM is a registered trademark of International Business Machines corporation in the United States and in other countries.)

Superconducting devices such as qubits are fabricated using superconducting and semiconductor materials in known semiconductor fabrication techniques. A superconducting device generally uses one or more layers of different materials to implement the device properties and function. A layer of material can be superconductive, conductive, semiconductive, insulating, resistive, inductive, capacitive, or have any number of other properties. Different layers of materials may have to be formed using different methods, given the nature of the material, the shape, size or placement of the material, other materials adjacent to the material, and many other considerations.

Superconducting devices are often planar, i.e., where the superconductor structures are fabricated on one plane. A non-planar device is a three-dimensional (3D) device where some of the structures are formed above or below a given plane of fabrication.

A q-processor is implemented as a set of more than one qubits. The qubits are fabricated as a lattice of co-planar devices on a single fabrication plane. Such an implementation of a q-processor is generally accepted as a fault-tolerant quantum architecture known as a Surface Code Scheme (SCS) or Surface Code Architecture (SCA).

SUMMARY

The illustrative embodiments provide a superconducting device, and a method and system of fabrication therefor. An embodiment of a superconducting coupling device includes a resonator structure. In the embodiment, the resonator structure has a first end configured to be coupled to a first device and a second end configured to be coupled to a second device. The embodiment further includes an electron system coupled to the resonator structure, and a gate positioned proximal to a portion of the electron system. In the embodiment, the electron system and the gate are configured to interrupt the resonator structure at one or more predetermined locations forming a switch. In the embodiment, the gate is configured to receive a gate voltage and vary an inductance of the electron system based upon the gate voltage. In the embodiment, the varying of the inductance induces the resonator structure to vary a strength of coupling between the first device and the second device.

In another embodiment, the varying of the inductance is a result of the gate varying a critical current of electron system. In another embodiment, the varying of the inductance induces a varying of a characteristic frequency of the resonator structure. In another embodiment, the varying of the characteristic frequency of the resonator structure enables the varying of the strength of coupling between the first device and the second device.

In another embodiment, the gate voltage is configured to vary the switch between a low inductance state with a high critical current, and a high inductance state with low critical current.

In another embodiment, at least a portion of the resonator structure is formed of a superconducting material. In another embodiment, the gate is formed of a metal material or of a superconducting material.

In another embodiment, the first device is capacitively coupled to the first end of the resonator structure, and the second device is capacitively coupled to the second end of the resonator structure.

Another embodiment further includes a ground plane coupled to the resonator structure by a shunt portion of the resonator structure. In another embodiment, the shunt portion of the resonator structure comprises the electron system.

In another embodiment, the electron system is coupled between a first portion of the resonator structure and a second portion of the resonator structure.

Another embodiment further includes a substrate structure, wherein the electron system is disposed upon a surface of the substrate structure.

Another embodiment further includes an insulator disposed upon the electron system, wherein the gate is disposed upon the insulating structure.

In another embodiment, the electron system includes a quantum well material disposed between a first barrier material and a second barrier material.

In another embodiment, the electron system comprises at least one of a semiconductor material or a graphene material.

In another embodiment, the first device is a first qubit and the second device is a second qubit.

An embodiment includes a fabrication method for fabricating the superconducting device.

An embodiment includes a fabrication system for fabricating the superconducting device.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

The illustrative embodiments used to describe the invention generally address and solve the above-described problems and other related problems by providing a tunable superconducting resonator for quantum computing devices. The illustrative embodiments also provide a fabrication method and system for fabricating a gate voltage-tunable electron system integrated with a superconducting resonator.

Figure 1:
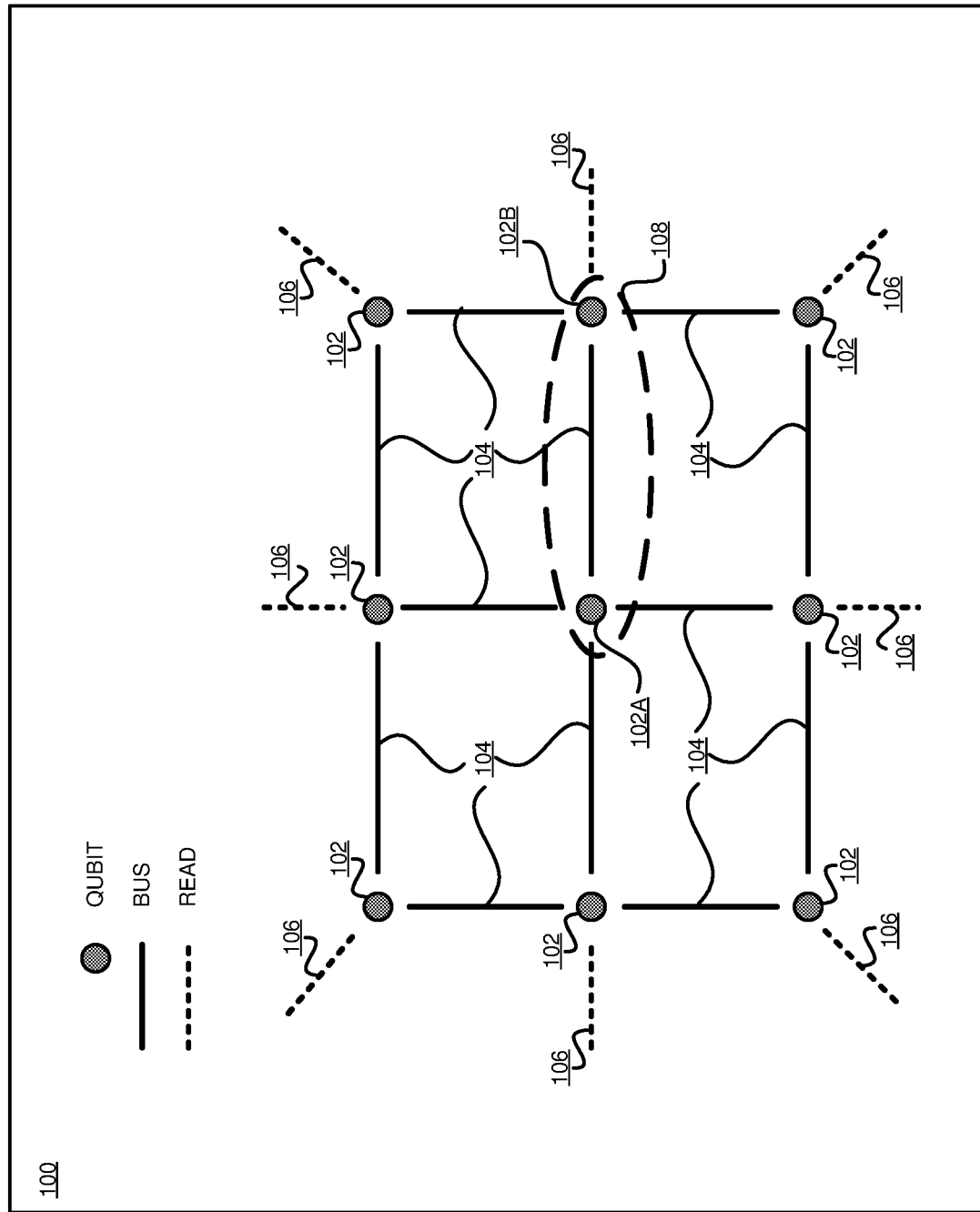
FIG. 1 depicts an example Surface Code Architecture (SCA) illustrating a problem that can be solved using an illustrative embodiment.

FIG. 1 depicts an example Surface Code Architecture (SCA) illustrating a problem that can be solved using an illustrative embodiment. Superconducting qubit architectures such as SCA 100 arrange a number of qubits 102, 102A, and 102B in a lattice formation on a planar two-dimensional (2D) grid. The qubits are coupled with each other and communicate using resonant lines 104 (also known as a "bus"). The quantum state of a qubit 102 is read using read lines 106 capacitively coupled to particular qubits.

Typically, read lines 106 are resonant lines in which the qubit state of a particular qubit is measured using dispersive readout. Dispersive readout uses dispersive interaction with a resonator in which the interaction results in a dispersive shift that causes the frequency of the resonator to change depending on the state of the qubit. The resonator frequency is interrogated with a microwave pulse, typically at a frequency near the midpoint of the resonant frequencies corresponding to the ground and excited states. The phase and amplitude of the reflected signal are used to distinguish the state of the qubit.

However, existing architectures using dispersive readout are subject to microwave cross-talk and/or frequency collisions between qubits resulting in performance degradation in quantum state measurements and correspondingly reduced performance of quantum computers.

In order to address the above problems with existing architectures, attempts have been made to develop architectures to allow tuning of coupling between qubits. Experimentally, tuning qubit coupling has previously relied upon controlling circuit elements with magnetic flux. However, these flux-tunable qubits suffer from several disadvantages including reduced coherence times due to flux-noise, the necessity of fine tuning of magnetic flux, their susceptibility to on-chip cross-talk (e.g., as high as 30%), heating due to current needed to generate the flux, and degradation of qubit performance due to shortened coherence time. Some recent activity has focused on developing voltage-controlled tuning of qubit coupling. One recent approach toward developing voltage-controlled tuning has included a proposal to controllably short two grounded transmons through a gate-tuned semiconductor switch. Another recent approach uses a voltage-controlled switch based on a semiconductor nanowire to controllably ground one end of a superconducting cavity to change coupling of grounded gatemons.

A solution is needed to provide for tunable superconducting resonators for quantum computing devices to address the above-described problems related to qubit coupling in order to provide advantages such as reduced microwave cross-talk and/or frequency collisions between qubits. For example, such a solution would enable controlling the coupling between qubit 102A and qubit 102B in order to reduce or eliminate microwave cross-talk and/or frequency collisions 108 between qubit 102A and qubit 102B during readout.

An embodiment provides a tunable coupling architecture for quantum computing devices. An embodiment includes a gate voltage-tunable electron system integrated with a superconducting resonator for a quantum computing device to form a gate voltage controlled switch integrated with a coupling resonator. In an embodiment, a portion of a gate-tunable electron system and gate are positioned to form a switch configured to interrupt superconducting resonator circuitry at key locations. In one or more embodiments, the gate-tunable electron system is a Josephson junction (JJ) switch. A Josephson junction (JJ) is formed of two or more superconductors coupled by a thin section of a non-superconducting material. In particular embodiments, the gate is formed of a metal material positioned proximate to the JJ switch.

In one or more embodiments, the gate disposed proximate to the JJ switch provides for a tunable JJ switch configured so that by providing a gate voltage to the gate, a critical current of the JJ switch is tuned based upon the gate voltage. The critical current in a superconducting material is the current below which the material is superconducting and above which the material is non-superconducting. By varying the critical current of the JJ switch, a Josephson inductance $L_J$ of the JJ switch varies in an inversely proportional manner. In an embodiment, a voltage applied to a proximal metal gate tunes the switch between a low inductance state with a high critical current (e.g., approximately 1-10 microamps (μA)) and a high inductance state with a low critical current (e.g. 10 nanoamps (nA).

For currents through the JJ switch that are small compared to the critical current, the Josephson inductance is given by:

$$L_J \approx \frac{\Phi_0}{2\pi I_c}$$

where $\Phi_0$ where is the magnetic flux quantum and $I_c$ is the critical current of the JJ switch. In an example, a critical current of 1 μA provides a Josephson inductance of 0.3 nH (nano Henry), and a critical current of 10 nA provides a Josephson inductance of 30 nH.

In the embodiment, varying gate voltage of the gate results in a varying of the Josephson inductance of the JJ switch and a corresponding varying of the characteristic frequency of the resonator coupling the qubits. Variation of the characteristic frequency of the resonator results in a variation of the strength of coupling between the qubits.

One or more embodiments provide for gradually tunable coupling between nearest-neighbor qubits via adjustment of the gate voltage. Another embodiment provides for multiplexed readout from qubits through gate voltage controlled JJ switch integration in readout resonators. Still another embodiment provides for the ability to shut off qubits with unwanted transition frequencies by shutting off or reducing the coupling of a qubit having unwanted transition frequencies with one or more other qubits. One or more embodiments provide for a novel quantum gate hardware approach with faster gates (e.g., approximately one nanosecond (ns) switch times) and tunable coupling strength between qubits.

Another embodiment provides a fabrication method for the gate voltage-tunable electron system integrated with a superconducting resonator, such that the method can be implemented as a software application. The application implementing a fabrication method embodiment can be configured to operate in conjunction with an existing superconducting fabrication system—such as a lithography system.

For the clarity of the description, and without implying any limitation thereto, the illustrative embodiments are described using an example number of qubits arranged in a lattice. An embodiment can be implemented with a different number of qubits, different arrangements in a lattice, a superconducting device other than a qubit, types of qubits not based on superconductors, or some combination thereof, within the scope of the illustrative embodiments. An embodiment can be implemented to similarly improve other superconducting fabrications where a tunable coupling to a superconducting element is desired.

Furthermore, a simplified diagram of the example tunable coupling resonator is used in the figures and the illustrative embodiments. In an actual fabrication of a tunable coupling resonator, additional structures that are not shown or described herein, or structures different from those shown and described herein, may be present without departing the scope of the illustrative embodiments. Similarly, within the scope of the illustrative embodiments, a shown or described structure in the example tunable coupling resonator may be fabricated differently to yield a similar operation or result as described herein.

Differently shaded portions in the two-dimensional drawing of the example structures, layers, and formations are intended to represent different structures, layers, materials, and formations in the example fabrication, as described herein. The different structures, layers, materials, and formations may be fabricated using suitable materials that are known to those of ordinary skill in the art.

A specific shape, location, position, or dimension of a shape depicted herein is not intended to be limiting on the illustrative embodiments unless such a characteristic is expressly described as a feature of an embodiment. The shape, location, position, dimension, or some combination thereof, are chosen only for the clarity of the drawings and the description and may have been exaggerated, minimized, or otherwise changed from actual shape, location, position, or dimension that might be used in actual lithography to achieve an objective according to the illustrative embodiments.

Furthermore, the illustrative embodiments are described with respect to a specific actual or hypothetical superconducting device, e.g., a qubit, only as an example. The steps described by the various illustrative embodiments can be adapted for fabricating a variety of tunable coupling resonators in a similar manner, and such adaptations are contemplated within the scope of the illustrative embodiments.

An embodiment when implemented in an application causes a fabrication process to perform certain steps as described herein. The steps of the fabrication process are depicted in the several figures. Not all steps may be necessary in a particular fabrication process. Some fabrication processes may implement the steps in different order, combine certain steps, remove or replace certain steps, or perform some combination of these and other manipulations of steps, without departing the scope of the illustrative embodiments.

The illustrative embodiments are described with respect to certain types of materials, electrical properties, structures, formations, layers orientations, directions, steps, operations, planes, dimensions, numerosity, data processing systems, environments, components, and applications only as examples. Any specific manifestations of these and other similar artifacts are not intended to be limiting to the invention. Any suitable manifestation of these and other similar artifacts can be selected within the scope of the illustrative embodiments.

The illustrative embodiments are described using specific designs, architectures, layouts, schematics, and tools only as examples and are not limiting to the illustrative embodiments. The illustrative embodiments may be used in conjunction with other comparable or similarly purposed designs, architectures, layouts, schematics, and tools.

The examples in this disclosure are used only for the clarity of the description and are not limiting to the illustrative embodiments. Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

Figure 2:
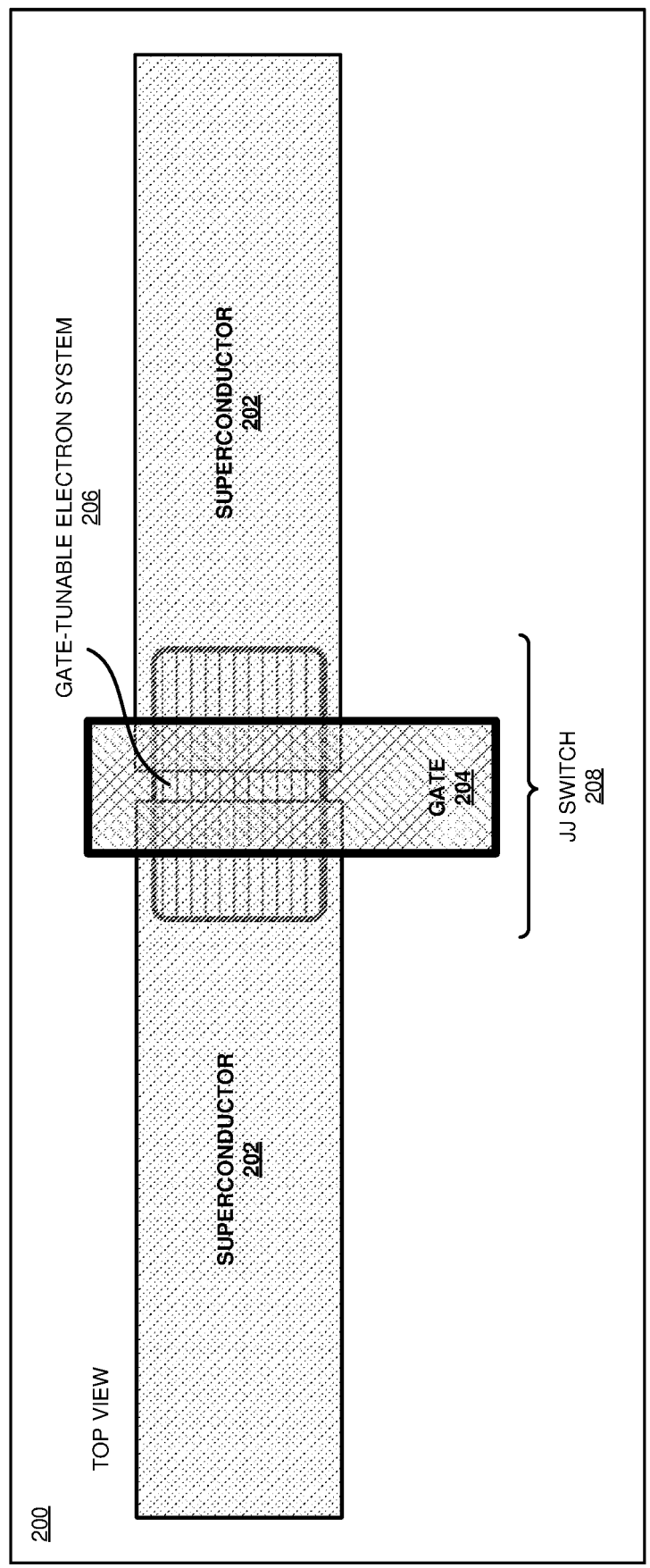
FIG. 2 depicts an example gate voltage-tunable electron system integrated with a superconducting resonator in accordance with an illustrative embodiment.

With reference to FIG. 2, this figure depicts an example gate voltage-tunable electron system integrated with a superconducting resonator in accordance with an illustrative embodiment. Top view 200 depicts a tunable superconducting resonator structure having a resonator center conductor 202 constructed of a superconducting material coupled to a gate-tunable electron system 206, and a gate 204 disposed proximal to gate-tunable electron system 206. In one or more embodiments, gate-tunable electron system 206, resonator center conductor 202, and gate 204 include a Josephson junction (JJ) switch 208. In one or more embodiments, a first end of resonator center conductor 202 is configured to be capacitively coupled to a first superconducting device such as a first qubit, and a second end of resonator center conductor 202 is configured to be capacitively coupled to a second superconducting device such as a second qubit.

In the illustrated embodiment, gate 204 is of a planar rectangular shape and positioned above, proximate, and orthogonal to a portion of gate-tunable electron system 206. In other particular embodiments, gate 204 may be of any suitable shape, size, or configuration. In particular embodiments, gate 204 is formed of a superconducting material or a metal material. In other embodiments, other gate and qubit structures may be used. In other embodiments, more than one qubit may be capacitively coupled to the resonator center conductor 202 at different locations along its length. In one or more embodiments, gate 204 and gate-tunable electron system 206 are separated by an insulator material or a vacuum. In an embodiment, gate 204 may overlap only part of gate-tunable electron system 206. In an embodiment, gate 204 may not overlap resonator center conductor 202.

In particular embodiments, possible superconducting materials of which resonator center conductor 202 or gate 204 may be formed include one or more of aluminum, indium, niobium, niobium nitride, niobium titanium nitride, niobium diselenide, tantalum, titanium, or molybdenum rhenium. In particular embodiments, possible metallic or conductive gate materials of which gate 204 may be formed include gold, platinum, palladium, gold alloys (e.g. palladium gold), copper, or graphite. It should be understood that the foregoing is a non-exhaustive list of possible superconducting materials and metallic materials, and in other embodiments other suitable superconducting materials or metallic materials may be used.

In an embodiment, a gate voltage is applied to metal gate 204 to cause a controllable variation in critical current within JJ switch 208, and thereby further cause a variation in Josephson inductance of JJ switch 208. The variation in Josephson inductance further causes a change in the characteristic frequency of the resonator comprising center conductor 202, which further changes the strength of coupling between two or more superconducting devices coupled to resonator center conductor 202. Accordingly, the gate voltage is configurable to tune the Josephson inductance and hence capable of detuning the resonator comprising center conductor 202 to change the strength of coupling between superconducting devices, for example, between a strongly coupled state and a weakly coupled (or decoupled) state.

Figure 3:
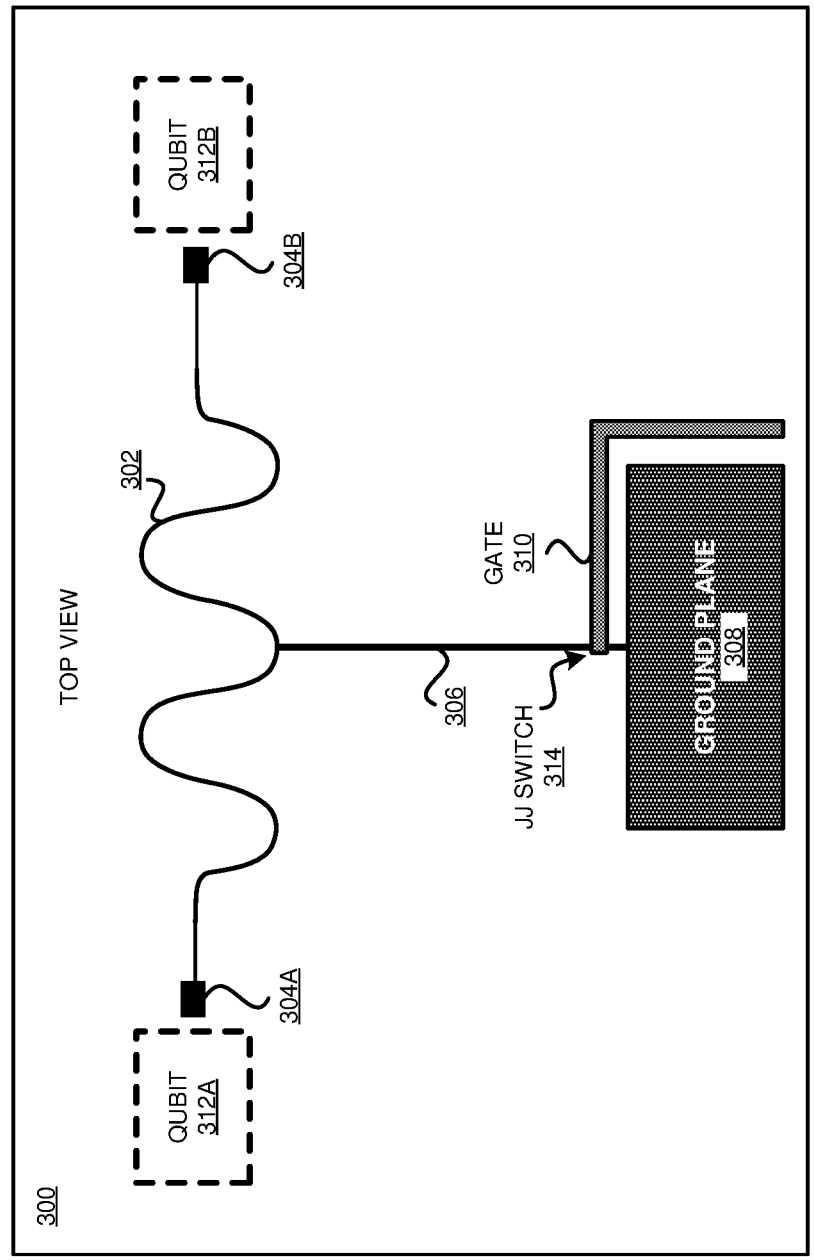
FIG. 3 depicts an example shunted gate-tunable coupling resonator in accordance with an illustrative embodiment.

With reference to FIG. 3, this figure depicts an example shunted gate-tunable coupling resonator in accordance with an illustrative embodiment. Top view 300 depicts a shunted tunable superconducting resonator structure having a resonator center conductor 302 constructed of a superconducting material connected to a first coupling pad 304A at one end and a second coupling pad 304B at another end. Resonator center conductor 302 is connected to a shunt portion 306 coupling resonator center conductor 302 to a ground plane 308. In an embodiment, resonator center conductor 302 and shunt portion 306 may be composed of a continuous piece of the same superconducting material. A JJ switch 314 is integrated in shunt portion 306 to controllably shunt the resonator based upon a gate voltage applied to the gate 310 of integrated JJ switch 314. In a particular embodiment, ground plane 308 is a superconducting ground plane formed of a superconducting material. In other embodiments, other gate and qubit structures may be used, and one or more JJ switches may be integrated into resonator center conductor 302 and/or the shunt portion 306 at any suitable locations along their respective lengths. In a particular embodiment, one JJ switch is integrated in resonator center conductor 302, and the shunt portion 306 contains no JJ switch.

In some embodiments, the ground plane 308 may be constructed in such a way that the resonator comprises a coplanar waveguide. In this geometry, the ground plane is separated from the resonator center conductor 302, as well as the shunt 306, on either side by a distance which does not vary along the length of the resonator. The dimensions are typically guided by design specifications for a transmission line with 50 ohm impedance in the frequency regime of 1 MHz-20 GHz. In the embodiment illustrated in FIG. 3, this ground plane geometry is not shown for clarity. In the particular embodiment illustrated in FIG. 3, resonator center conductor 302 is shown in a meandering configuration. In other particular embodiments, resonator center conductor 302 may be in a straight configuration or any other suitable resonator configuration.

In the particular embodiment illustrated in FIG. 3, shunt portion 306 is shown in a straight configuration. In other particular embodiments, shunt portion 306 may be in a meandering configuration of any other suitable configuration. In other particular embodiments, the length of shunt portion 306 may be substantially longer than shown in FIG. 3. In other particular embodiments, the length of shunt portion 306 may be no longer than is necessary to integrate the JJ switch (e.g. approximately the length of the JJ switch). In other embodiments, shunt portion 306 may connect to resonator center conductor 302 at a different location than shown in FIG. 3.

First coupling pad 304A is configured to capacitively couple a first qubit 312A to resonator center conductor 302, and second coupling pad 304B is configured to capacitively couple a second qubit 312B to resonator center conductor 302. In other embodiments, first coupling pad 304A is configured to capacitively couple qubit 312A to resonator center conductor 302, and second coupling pad 304B is configured to capacitively couple to another device. In some embodiments, first coupling pad 304A is configured to capacitively couple qubit 312A to resonator center conductor 302, and second coupling pad 304B couples directly to readout measurement circuitry, for example using a wirebond or bump bond.

In an embodiment, a gate voltage is applied to the gate 310 of integrated JJ switch 314 to cause a controllable variation in critical current of the junction and thereby further cause a variation in Josephson inductance $L_J$. The variation in Josephson inductance $L_J$ further causes a change in the characteristic frequency of the resonator comprising center conductor 302, which further changes the strength of coupling between first qubit 312A and second qubit 312B. Accordingly, the gate voltage is configurable to tune the Josephson inductance $L_j$ and hence capable of detuning the frequency of the resonator comprising center conductor 302 to change the strength of coupling between first qubit 312A and second qubit 312B.

Figure 4:
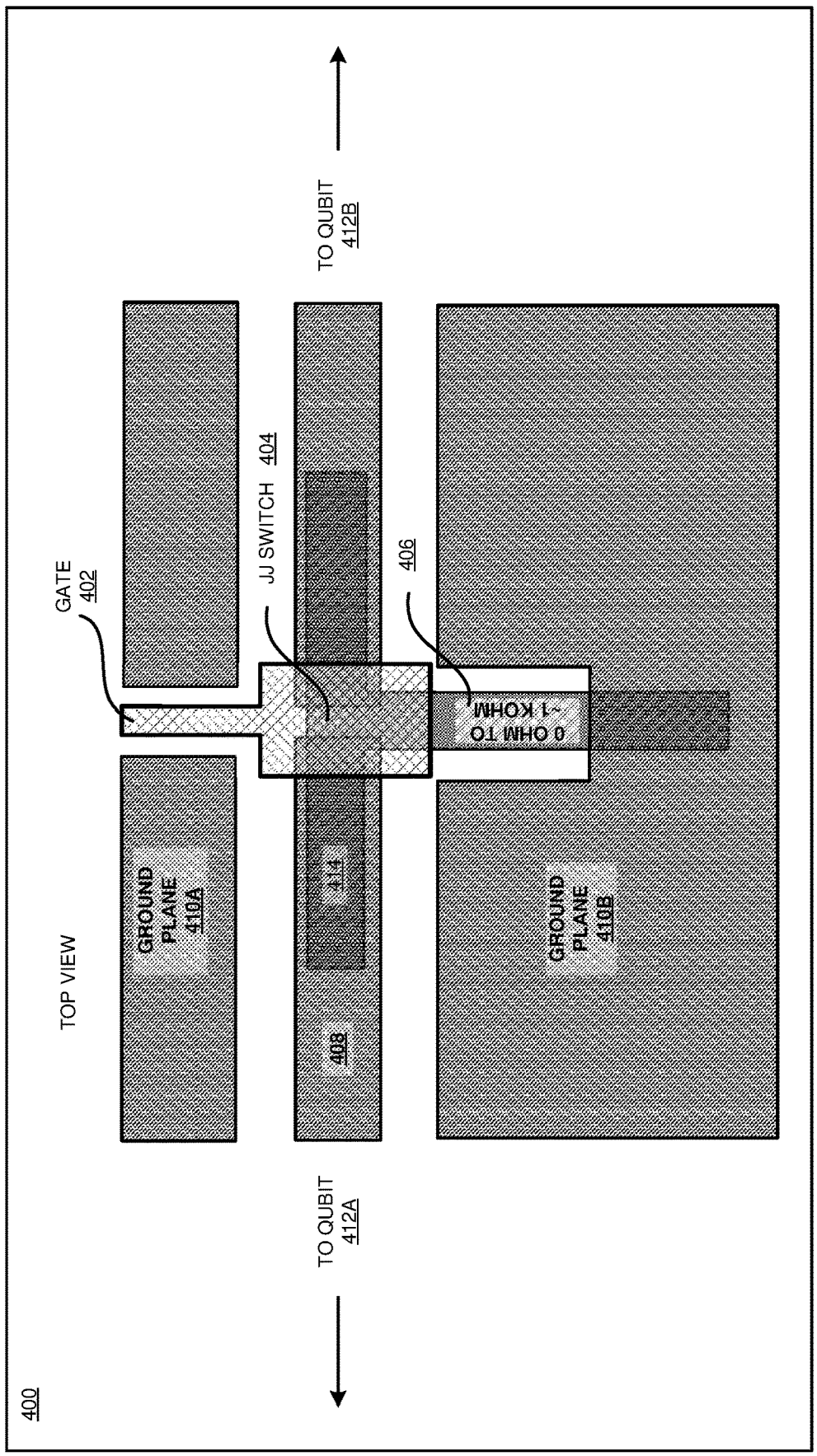
FIG. 4 depicts an example inline integration of a gate voltage-tunable electron system integrated with a superconducting coupling resonator in accordance with an illustrative embodiment.

With reference to FIG. 4, this figure depicts an example inline integration of a gate voltage-tunable electron system integrated with a superconducting coupling resonator in accordance with an illustrative embodiment. Top view 400 depicts an integrated 'T' shaped gate voltage-tunable electron system 414 and superconducting coupling resonator structure having a gate 402 disposed proximate and orthogonal to a portion of a JJ switch 404. JJ switch 404 is coupled between two portions of a resonator center conductor 408 constructed of a superconducting material.

A portion of gate 402 is proximate to a first ground plane 410A, and a shunt portion 406 of electron system 414 is coupled to a second ground plane 410B. In a particular embodiment, first ground plane 410A and second ground plane 410B are each a superconducting ground plane formed of a superconducting material. In a particular embodiment, shunt portion 406 of electron system 414 has a resistance of less than or approximately equal to 1 kiloohm (Kohm). Resonator center conductor 408 is capacitively coupled to a first qubit 412A at one end and a second qubit 412B at another end.

Embodiments of the invention are flexible with respect to implementation of the shunt electron system 406. In some embodiments, the geometry of shunt portion 406 and ground plane 410B may be chosen to determine the resistance of shunt portion 406. Although ground plane 410B is shown with a cut-out rectangular portion near shunt 406, in some embodiments ground plane 410B may not have this cut-out portion. In some embodiments the shunt portion of electron system 414 is superconducting due to proximity effect from ground plane 410B and resonator center conductor 408. In some embodiments, shunt portion 406 connects ground plane 410B to resonator center conductor 408 at a different location from JJ switch 404, such that shunt portion 406 and JJ switch 404 comprise two different electron systems.

In an embodiment, gate 402 and JJ switch 404 are configured to cause a controllable variation in the critical current of JJ switch 404, and thereby cause a variation in the Josephson inductance $L_J$ of JJ switch 404. The variation in Josephson inductance $L_J$ further causes a change in the characteristic frequency of the resonator in structure 400, which further changes a strength of coupling between superconducting devices (e.q. qubit 412A and qubit 412B) coupled to the device. In other embodiments, other gate and gate-tunable electronic systems may be used, and the gate structure may gate all or part of the gate-tunable electronic system.

Figure 5:
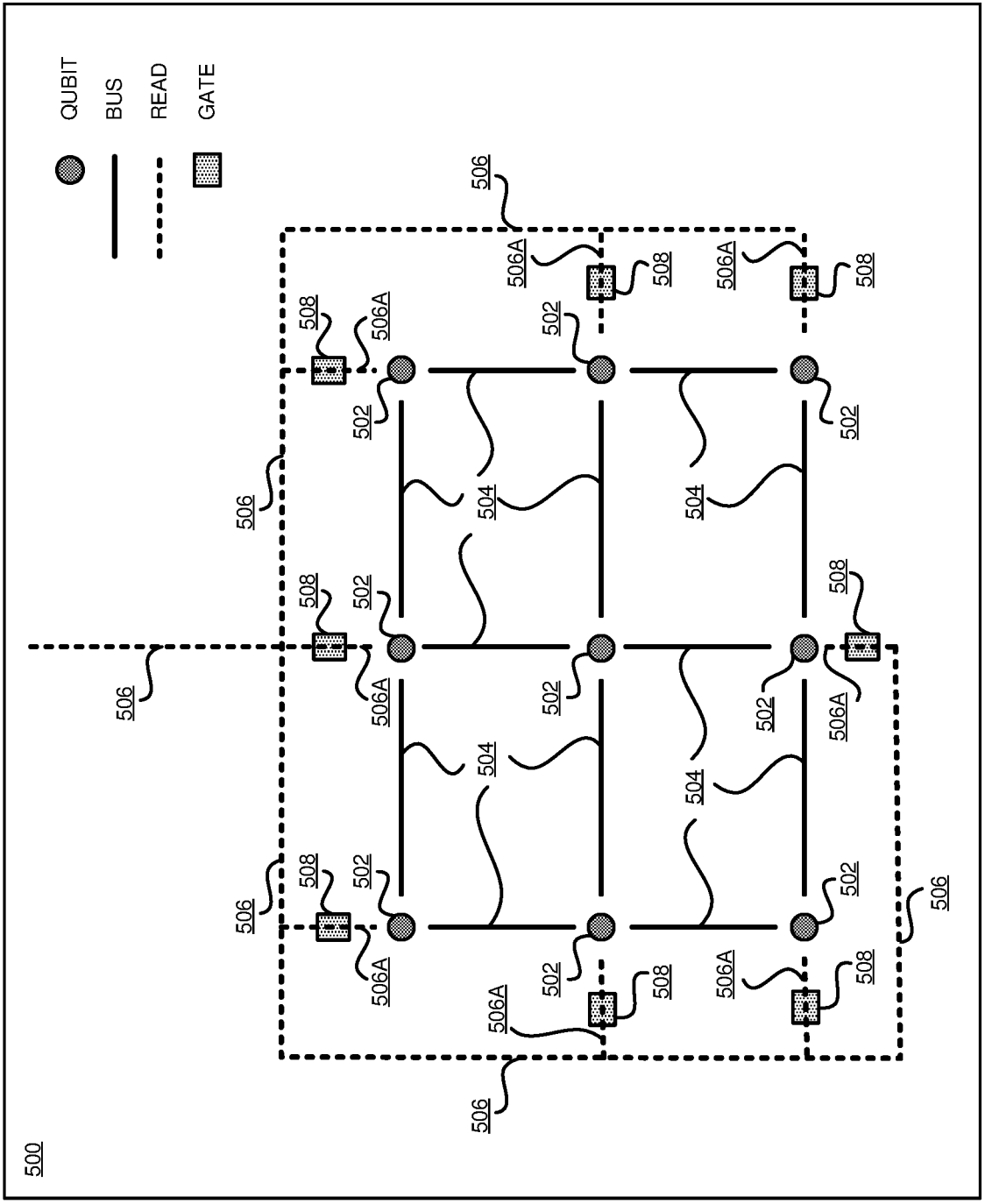
FIG. 5 depicts an example implementation of gate voltage-tunable electron systems integrated with superconducting resonators in an SCA arrangement accordance with an illustrative embodiment.

With reference to FIG. 5, this figure depicts an example implementation of gate voltage-tunable electron systems integrated with superconducting resonators in an SCA arrangement accordance with an illustrative embodiment. Top view 500 depicts a number of qubits 502 in a lattice formation on a planar two-dimensional (2D) grid. The qubits are coupled with each other and communicate using resonant lines 504 (also known as a "bus"). The quantum state of a qubit 502 is read using read lines 506, 506A capacitively coupled to particular qubits. Each of read lines 506A further include an integrated gate/JJ switch 508 disposed proximate thereto to form a gate voltage-tunable electron system integrated with a superconducting resonator such as described herein with respect to various embodiments.

In the illustrated embodiment, each of read lines 506A and the corresponding integrated gate/JJ switch 508 form a gate-tunable readout resonator configured to receive an individually controllable gate voltage to allow controlled coupling and decoupling of a particular qubit 502 from a read line 506. In one or more embodiments, the individually gated sections of gate-tunable readout resonators provide for the capability of multiplexed readout of qubits 502 through tunable readout resonators.

Figure 6:
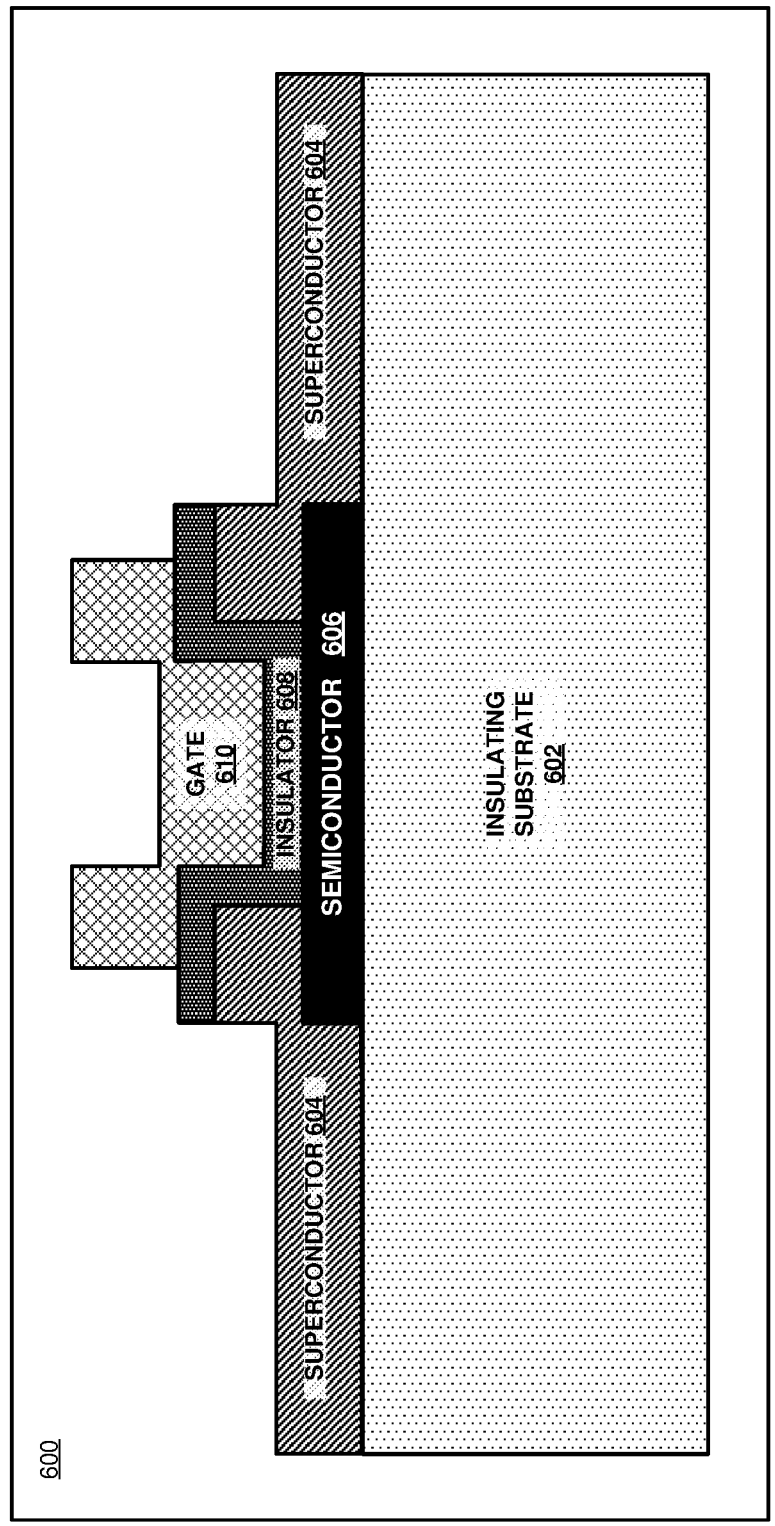
FIG. 6 depicts a cross-section view of gate voltage-tunable electron system integrated with a superconducting resonator device structure according to an illustrative embodiment.

With reference to FIG. 6, this figure depicts a crosssection view of gate voltage-tunable electron system integrated with a superconducting resonator device structure 600 according to an illustrative embodiment. Structure 600 includes an insulating substrate structure 602 having first and second portions of superconducting material 604 formed on a surface (e.g., a top surface) of insulating substrate structure 602. In particular embodiments, insulating substrate structure 602 can be formed of any suitable substrate material, such as silicon (Si) or sapphire.

Structure 600 further includes a semiconductor material layer 606 disposed on the surface of insulating substrate structure 602 between the first and second portions of superconducting material 604. In the embodiment illustrated in FIG. 6, portions of superconducting material 604 overlap portions of semiconductor material layer 606. In a particular embodiment, semiconductor material layer 606 is formed of an indium arsenide (InAs) material. Together the junction of the first and second portions of superconducting material 604 and semiconductor material layer 606 form a gate tunable electron system such as a JJ switch.

Structure 600 further includes an insulator layer 608 deposited upon an exposed portion of semiconductor material layer 606 and the overlapping portions of superconducting material 604. In a particular embodiment, insulator layer 608 is formed of an oxide material. Structure 600 further includes a gate material 610 deposited upon insulator layer 608 forming a gate of the gate voltage-tunable electron system integrated with a superconducting resonator device. In particular embodiments, possible metallic or conductive gate materials of which gate material 610 may be formed include gold, platinum, palladium, gold alloys (e.g. palladium gold), copper, or graphite. In particular embodiments, possible superconducting materials of which superconducting material 604 or gate material 610 may be formed include aluminum, indium, niobium, niobium nitride, niobium titanium nitride, niobium diselenide, tantalum, titanium, or molybdenum rhenium. It should be understood that the foregoing is a non-exhaustive list of possible superconducting materials and metallic materials, and in other embodiments other suitable superconducting materials or metallic materials may be used. It should also be understood that insulator 608 is optional and may not be present according to particular embodiments.

In an embodiment, a gate voltage is applied to gate material 610 to cause a controllable variation in critical current within the superconductor/semiconductor junction, and thereby further cause a variation in Josephson inductance $L_j$. The variation in Josephson inductance $L_j$ further causes a change in the characteristic frequency of the resonator in structure 600, which further changes a strength of coupling between superconducting devices (e.g., qubits) coupled to the device.

Figure 7:
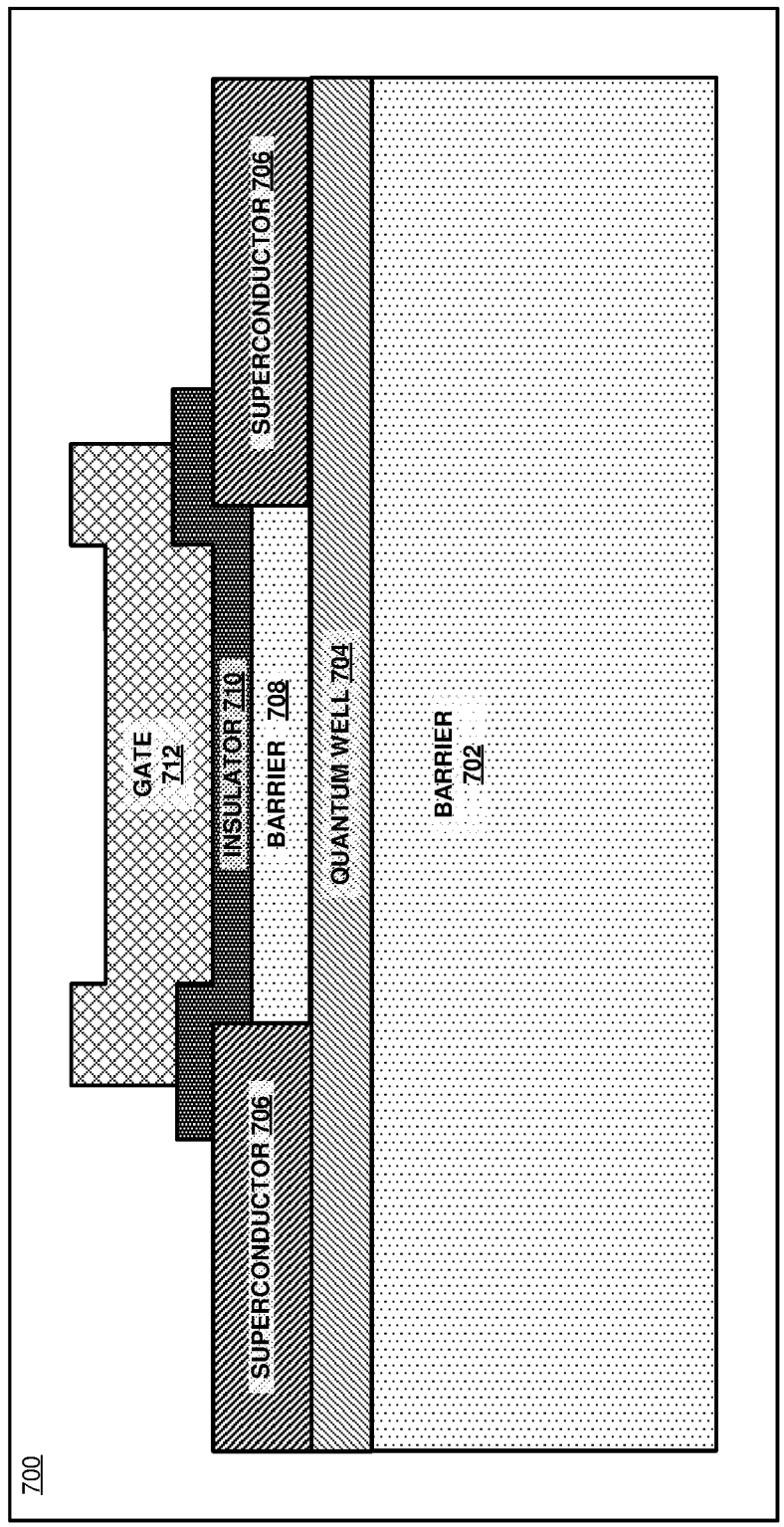
FIG. 7 depicts a cross-section view of gate voltage-tunable electron system integrated with a superconducting resonator device structure according to another illustrative embodiment.

With reference to FIG. 7, this figure depicts a cross-section view of gate voltage-tunable electron system integrated with a superconducting resonator device structure 700 according to another illustrative embodiment. Structure 700 includes a molecular-beam epitaxy (MBE) grown heterostructure. Structure 700 includes a first barrier layer 702 having a quantum well layer 704 formed on a surface (e.g., a top surface) of first barrier layer 702.

Structure 700 further includes first and second portions of a superconducting material 706 formed on a surface (e.g., a top surface) of quantum well layer 704 and a second barrier layer 708 disposed on the surface of quantum well layer 704 between the first and second portions of superconducting material 706.

In some embodiments, superconducting material 706 may not be disposed on the surface of quantum well layer 704, but instead may be formed in another suitable manner. For example, the superconductor 706 could extend into the quantum well 704, or the bottom surface of the superconductor 706 could be disposed slightly above the quantum well in barrier 708. Furthermore, although in 700 the bottom surface of superconductor 706 is depicted as flat, in some embodiments this may not be the case. For example, the superconductor 706 may contact the quantum well 704 in manner that is not spatially uniform, or superconducting material from superconductor 706 may migrate partially into the quantum well 704 as part of the fabrication process.

In the illustrated embodiment, first barrier layer 702, quantum well layer 704, and second barrier layer 708 form a quantum well. A quantum well is a potential well with discrete energy values which causes quantum confinement. In various embodiments, one or more of first barrier layer 702, quantum well layer 704, and second barrier layer 708 are formed using an MBE process. In a particular example, quantum well layer 704 is formed of an InAs material, and first barrier layer 702 and second barrier layer 708 are formed of an InGaAs material. In another particular example, quantum well layer 704 is formed of a Ge material, and first barrier layer 702 and second barrier layer 708 are formed of a SiGe material.

In other particular embodiments, possible materials for quantum well layer 704, first barrier layer 702, and second barrier layer 708 may include:

| Quantum Well | Barrier |
|---|---|
| InAs | $Al_xGa_{1-x}Sb$ |
| InAs | $In_xGa_{1-x}As$ |
| GaAs | $Al_xGa_{1-x}As$ |
| Ge | $Si_xGe_{1-x}$ |
| Si | $Si_xGe_{1-x}$ |
| $Si_yGe_{1-y}$ | $Si_xGe_{1-x}$ |
| HgTe | $Hg_xCd_{1-x}Te$ |
| InSb | $In_xAl_{1-x}Sb$ |
| $In_xGa_{1-x}As$ | $In_yAl_{1-y}As$ |
| $In_xGa_{1-x}As$ | $In_yGa_{1-y}As$ |

In the embodiment illustrated in FIG. 7, together the junction of the first and second portions of superconducting material 706, first barrier layer 702, quantum well layer 704, and second barrier layer 708 form a gate tunable electron system such as a JJ switch.

Structure 700 further includes an insulator layer 710 deposited an exposed portion of second barrier layer 708 and overlapping portions of superconducting material 706. In a particular embodiment, insulator layer 710 is formed of an oxide material. Structure 700 further includes a gate material 712 deposited upon insulator layer 710 forming a gate of the gate voltage-tunable electron system integrated with a superconducting resonator device.

In an embodiment, a gate voltage is applied to gate material 712 to cause a controllable variation in critical current within the superconductor/semiconductor junction, and thereby further cause a variation in Josephson inductance $L_j$. The variation in Josephson inductance $L_j$ further causes a change in the characteristic frequency of the resonator in structure 700, which further changes a strength of coupling between superconducting devices (e.g., qubits) coupled to the device. It should be understood that insulator 710 is optional and may not be present according to particular embodiments.

In some embodiments, the structure in 700 may include dopants, or atoms inserted at certain locations in the structure. For example, dopants may be used to control the carrier density in the JJ switch when zero voltage is applied to the gate 712. Hence, dopants may be used to control the range of gate voltage needed to operate the switch. In some embodiments, dopants may be disposed in a thin layer in barrier 702 and/or in barrier 708, at a constant distance from the quantum well 704 (e.g. a delta-doping scheme).

In some embodiments, a quantum well may also be formed at an interface between two disparate semiconductors. For example, barrier 708 and quantum well 704 may both be composed of the same semiconductor (e.g. GaAs), and barrier 702 may be composed of a different semiconductor (e.g. AlGaAs). Furthermore, a delta-doping layer may be present in barrier 702. In this circumstance a quantum well may form in the quantum well layer 704 near the interface with barrier 702.

Figure 8:
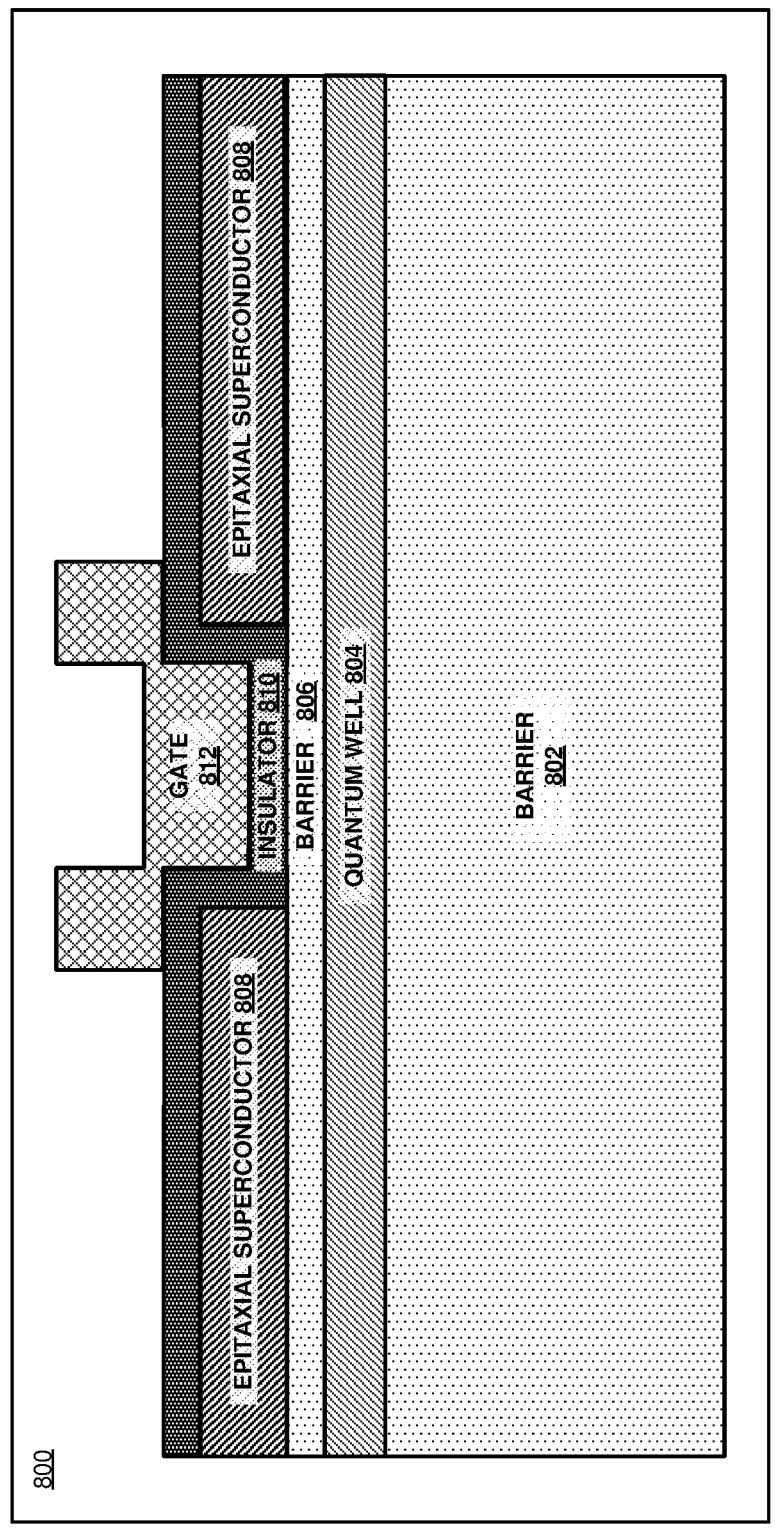
FIG. 8 depicts a cross-section view of gate voltage-tunable electron system integrated with a superconducting resonator device structure according to another illustrative embodiment.

With reference to FIG. 8, this figure depicts a cross-section view of gate voltage-tunable electron system integrated with a superconducting resonator device structure 800 according to another illustrative embodiment. Structure 800 includes a MBE grown quantum well heterostructure with MBE grown superconducting contacts. Structure 800 includes a first barrier layer 802 having a quantum well layer 804 formed on a surface (e.g., a top surface) of first barrier layer 802.

Structure 800 further includes a second barrier layer 806 disposed on the surface of quantum well layer 804 and first and second portions of a superconducting material 808 formed on a surface (e.g., a top surface) of second barrier layer 806. In the illustrated embodiment, first and second portions of a superconducting material 808 are formed on second barrier layer 806 using an epitaxial process.

In the illustrated embodiment, first barrier layer 802, quantum well layer 804, and second barrier layer 806 form a quantum well. In various embodiments, one or more of first barrier layer 802, quantum well layer 804, and second barrier layer 806 are formed using an MBE process. In a particular example, quantum well layer 804 is formed of an InAs material, and first barrier layer 802 and second barrier layer 806 are formed of an InGaAs material. In another particular example, quantum well layer 804 is formed of a Ge material, and first barrier layer 802 and second barrier layer 806 are formed of a SiGe material.

Together the junction of the first and second portions of superconducting material 808, first barrier layer 802, quantum well layer 804, and second barrier layer 806 form a gate tunable electron system such as a JJ switch.

Structure 800 further includes an insulator layer 810 deposited on an exposed portion of second barrier layer 806 and the first and second portions of superconducting material 808. In a particular embodiment, insulator layer 810 is formed of an oxide material. Structure 800 further includes a gate material 812 deposited upon insulator layer 810 forming a gate of the gate voltage-tunable electron system integrated with a superconducting resonator device. It should be understood that insulator 810 is optional and may not be present according to particular embodiments.

In an embodiment, a gate voltage is applied to gate material 812 to cause a controllable variation in critical current within the superconductor/semiconductor junction, and thereby further cause a variation in Josephson inductance $L_j$. The variation in Josephson inductance $L_J$ further causes a change in the characteristic frequency of the resonator in structure 800, which further changes a strength of coupling between superconducting devices (e.g., qubits) coupled to the device.

In some embodiments, the structure in 800 may include dopants, or atoms inserted at certain locations in the structure. For example, dopants may be used to control the carrier density in the JJ switch when zero voltage is applied to the gate 812. Hence, dopants may be used to control the range of gate voltage needed to operate the switch. In some embodiments, dopants may be disposed in a thin layer in barrier 802 and/or in barrier 806, at a constant distance from the quantum well 804 (e.g. a delta-doping scheme).

In some embodiments, a quantum well may also be formed at an interface between two disparate semiconductors. For example, barrier 806 and quantum well 804 may both be composed of the same semiconductor (e.g. GaAs), and barrier 802 may be composed of a different semiconductor (e.g. AlGaAs). Furthermore, a delta-doping layer may be present in barrier 802. In this circumstance a quantum well may form in the quantum well layer 804 near the interface with barrier 802.

Figure 9:
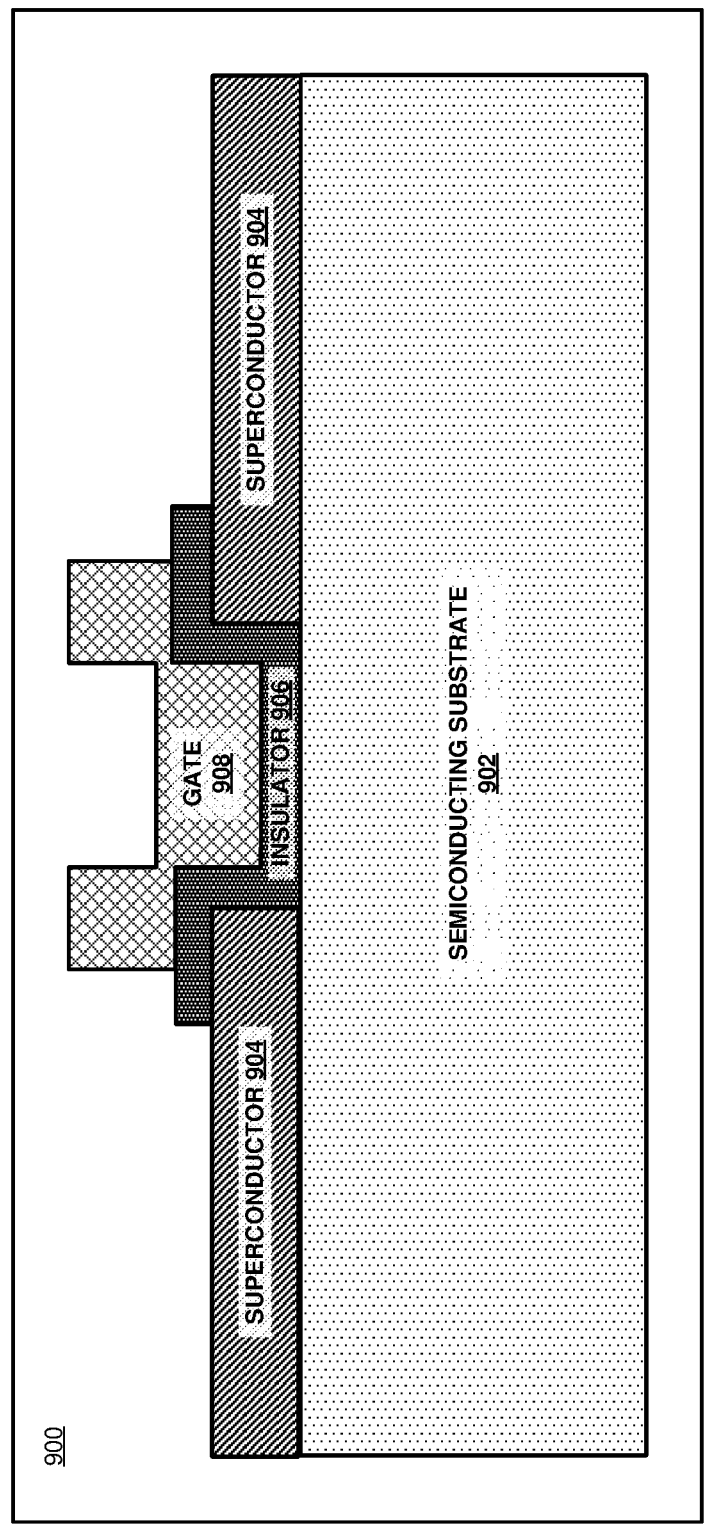
FIG. 9 depicts a cross-section view of gate voltage-tunable electron system integrated with a superconducting resonator device structure according to another illustrative embodiment.

With reference to FIG. 9, this figure depicts a cross-section view of gate voltage-tunable electron system integrated with a superconducting resonator device structure 900 according to another illustrative embodiment. Structure 900 includes a semiconducting substrate structure 902 having first and second portions of superconducting material 904 formed on a surface (e.g., a top surface) of semiconducting substrate structure 902. In particular embodiments, semiconducting substrate structure 902 is a proximitized semiconducting substrate formed of a semiconducting material such as Si. Together the junction of the first and second portions of superconducting material 904 and semiconducting substrate layer 902 form a gate tunable electron system such as a JJ switch.

Structure 900 further includes an insulator layer 906 deposited upon an exposed portion of semiconducting substrate layer 902 and the overlapping portions of portions of superconducting material 904. In a particular embodiment, insulator layer 906 is formed of an oxide material. Structure 900 further includes a gate material 908 deposited upon insulator layer 906 forming a gate of the gate voltage-tunable electron system integrated with a superconducting resonator device. In particular embodiments, possible metallic or conductive gate materials of which gate material 908 may be formed include gold, platinum, palladium, gold alloys (e.g. palladium gold), copper, or graphite. In particular embodiments, possible superconducting materials of which superconducting material 904 or gate material 908 may be formed include aluminum, indium, niobium, niobium nitride, niobium titanium nitride, niobium diselenide, tantalum, titanium, or molybdenum rhenium. It should be understood that the foregoing is a non-exhaustive list of possible superconducting materials and metallic materials, and in other embodiments other suitable superconducting materials or metallic materials may be used. It should also be understood that insulator 908 is optional and may not be present according to particular embodiments.

In an embodiment, a gate voltage is applied to gate material 908 to cause a controllable variation in critical current within the superconductor/semiconductor junction, and thereby further cause a variation in Josephson inductance $L_j$. The variation in Josephson inductance $L_J$ further causes a change in the characteristic frequency of the resonator in structure 900, which further changes a strength of coupling between superconducting devices (e.g., qubits) coupled to the device.

Figure 10:
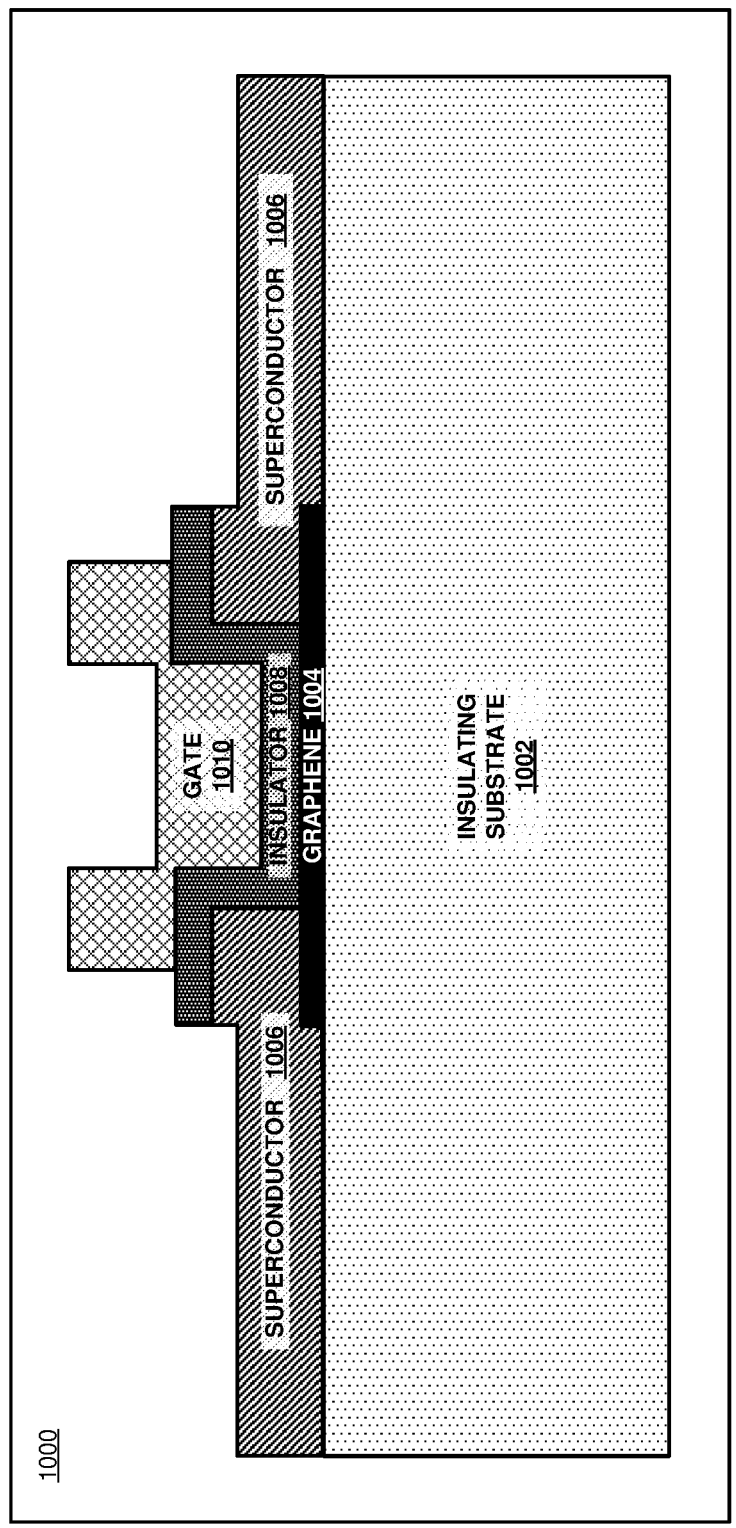
FIG. 10 depicts a cross-section view of gate voltage-tunable electron system integrated with a superconducting resonator device structure according to an illustrative embodiment.

With reference to FIG. 10, this figure depicts a cross-section view of gate voltage-tunable electron system integrated with a superconducting resonator device structure 1000 according to an illustrative embodiment. Structure 1000 includes an insulating substrate structure 1002 having a graphene layer 1004 formed of graphene material disposed on a portion of a surface (e.g., a top surface) of insulating substrate structure 1002. In a particular embodiment, insulating substrate structure 1002 is formed of silicon. In a particular embodiment, insulating substrate material may be silicon with a boron nitride material disposed on a portion of its surface and underneath the graphene layer 1004.

Structure 1000 further includes first and second portions of superconducting material 1006 formed on the surface of insulating substrate structure 1002 and a portion of graphene layer 1004 with graphene layer 1004 disposed between the first and second portions of superconducting material 1006. Together the junction of the first and second portions of superconducting material 1006 and graphene layer 1004 form a gate tunable electron system such as a JJ switch.

Structure 1000 further includes an insulator layer 1008 deposited upon an exposed portion of graphene layer 1004 and the overlapping portions of portions of superconducting material 1006. In a particular embodiment, insulator layer 1008 is formed of an oxide material. In a particular embodiment, insulator layer 1008 is a boron nitride material. Structure 1000 further includes a gate material 1010 deposited upon insulator layer 1008 forming a gate of the gate voltage-tunable electron system integrated with a superconducting resonator device. In particular embodiments, possible metallic or conductive gate materials of which gate material 1010 may be formed include gold, platinum, palladium, gold alloys (e.g. palladium gold), copper, or graphite. In particular embodiments, possible superconducting materials of which superconducting material 1006 or gate material 1010 may be formed include aluminum, indium, niobium, niobium nitride, niobium titanium nitride, niobium diselenide, tantalum, titanium, or molybdenum rhenium. It should be understood that the foregoing is a non-exhaustive list of possible superconducting materials and metallic materials, and in other embodiments other suitable superconducting materials or metallic materials may be used.

In an embodiment, a gate voltage is applied to gate material 1010 to cause a controllable variation in critical current within the superconductor/graphene junction, and thereby further cause a variation in Josephson inductance $L_j$. The variation in Josephson inductance $L_J$ further causes a change in the characteristic frequency of the resonator in structure 1000, which further changes a strength of coupling between superconducting devices (e.g., qubits) coupled to the device.

In other particular embodiments, layer 1004 may comprise thin film materials such as one or more of $Bi_2Te_3$, $Bi_2Se_3$, $Sb_2Te_3$, $Sb_2Se_3$. In particular embodiments, layer 1004 may be monolayer graphene or bilayer graphene.

Figure 11:
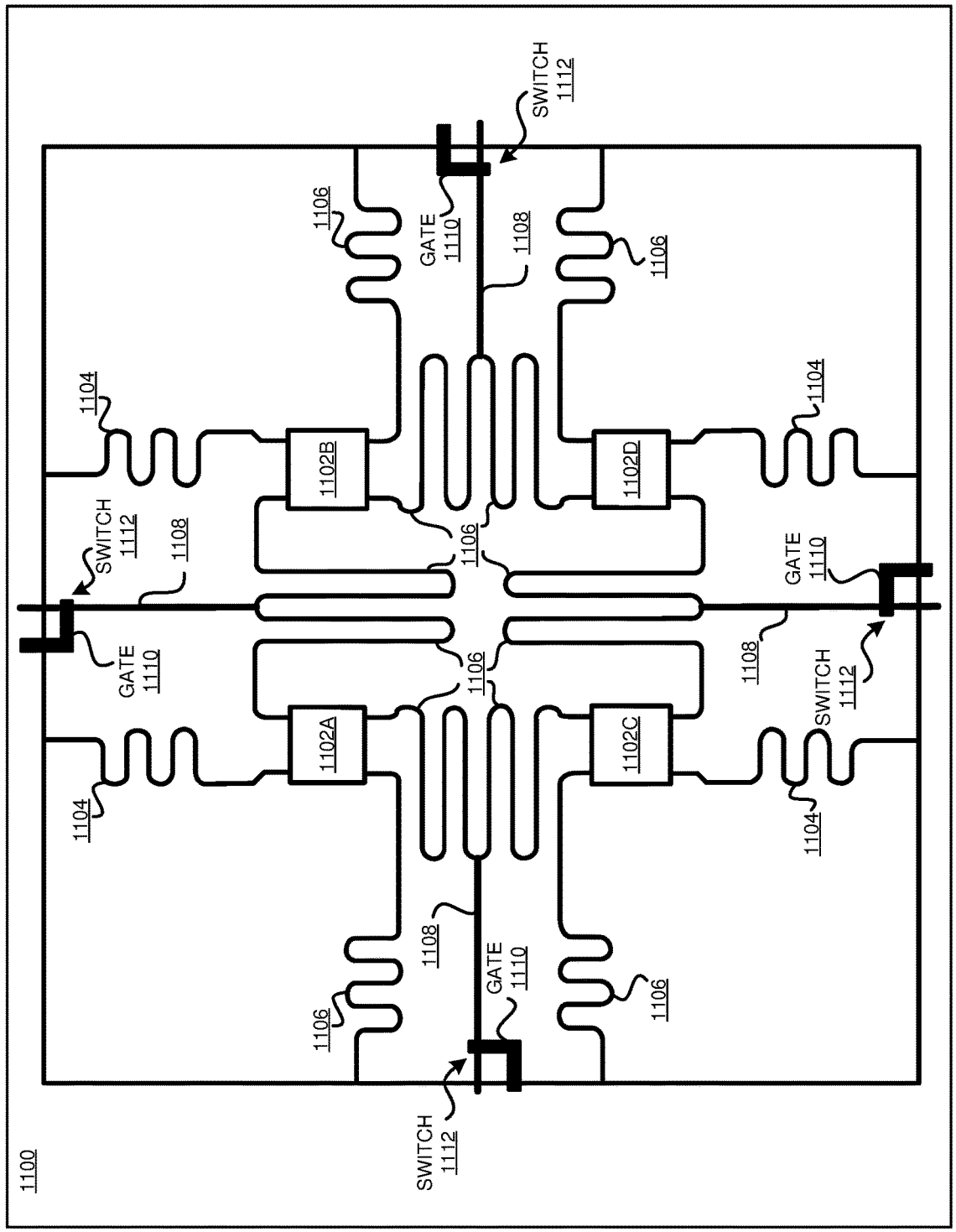
FIG. 11 depicts an example implementation of gate voltage-tunable electron systems integrated with superconducting resonators in an multibit device architecture in accordance with an illustrative embodiment.

With reference to FIG. 11, this figure depicts an example implementation of gate voltage-tunable electron systems integrated with superconducting resonators in a multi-qubit device architecture in accordance with an illustrative embodiment. Top view 1100 depicts a number of qubits 1102A-1102D in a lattice formation on a planar two-dimensional (2D) grid. In some embodiments, qubits 1102A-1102D are transmon qubits. The quantum state of a qubit 1102A-1102D is read using read lines 1104 capacitively coupled to particular qubits. The qubits are coupled with each other and communicate using resonant lines 1106 (also known as a "bus").

Resonant lines 1106 can further include a shunt 1108 coupled thereto, including a JJ switch 1112 and a gate 1110 disposed proximate to the corresponding JJ switch 1112 to form a gate-tunable resonator such as described herein with respect to various embodiments. In the illustrated embodiment, each of switch 1112 and the corresponding gate 1110 are configured to receive an individually controllable gate voltage to allow controlled coupling and decoupling of pairs of qubits 1102A-1102D. In one or more embodiments, the individually gated sections of gate-tunable resonators provide for the capability of gradually tuning coupling between nearest-neighbor qubits. In one or more embodiments, the individually gated sections of gate-tunable resonators provide for the capability of shutting off qubits with unwanted transition frequencies. In one or more embodiments, the individually gated sections of gate-tunable resonators provide for a novel quantum gate hardware approach with faster gates and tunable coupling strength between qubits.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "illustrative" is used herein to mean "serving as an example, instance or illustration." Any embodiment or design described herein as "illustrative" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A superconducting coupling device comprising:
   a resonator structure, the resonator structure having a first end that is capacitively coupled to a first qubit and a second end that is capacitively coupled to a second qubit;
   an electron system coupled to the resonator structure; and
   a gate positioned proximal to a portion of the electron system, the electron system and the gate configured to interrupt the resonator structure at one or more predetermined locations forming a switch, the gate configured to receive a gate voltage and vary an inductance of the electron system based upon the gate voltage, the varying of the inductance inducing the resonator structure to vary a strength of coupling between the first qubit and the second qubit,
   wherein the resonator structure, electron system and gate are configured to create a Josephson junction switch.

2. The superconducting coupling device of claim 1, wherein the varying of the inductance is a result of the gate varying a critical current of electron system.

3. The superconducting coupling device of claim 1, wherein the varying of the inductance induces a varying of a characteristic frequency of the resonator structure.

4. The superconducting coupling device of claim 3, wherein the varying of the characteristic frequency of the resonator structure enables the varying of the strength of coupling between the first qubit and the second qubit.

5. The superconducting coupling device of claim 1, wherein the gate voltage is configured to vary the switch between a low inductance state with a high critical current, and a high inductance state with low critical current.

6. The superconducting coupling device of claim 1, wherein at least a portion of the resonator structure is formed of a superconducting material.

7. The superconducting coupling device of claim 1, wherein the gate is formed of a metal material or of a superconducting material.

8. The superconducting coupling device of claim 1, further comprising a ground plane coupled to the resonator structure by a shunt portion of the resonator structure.

9. The superconducting coupling device of claim 8, wherein the shunt portion of the resonator structure comprises the electron system.

10. The superconducting coupling device of claim 1, wherein the electron system is coupled between a first portion of the resonator structure and a second portion of the resonator structure.

11. The superconducting coupling device of claim 1, further comprising a substrate structure, wherein the electron system is disposed upon a surface of the substrate structure.

12. The superconducting coupling device of claim 11, further comprising an insulator disposed upon the electron system, wherein the gate is disposed upon the insulator.

13. The superconducting coupling device of claim 11, wherein the electron system includes a quantum well material disposed between a first barrier material and a second barrier material.

14. The superconducting coupling device of claim 1, wherein the electron system comprises at least one of a semiconductor material or a graphene material.

15. A method comprising:
   capacitively coupling a first end of a resonator structure to a first qubit;
   capacitively coupling a second end of the resonator structure to a second qubit;
   coupling an electron system to the resonator structure;
   positioning a gate proximal to a portion of the electron system;
   interrupting, by the electron system and the gate, the resonator structure at one or more predetermined locations forming a Josephson junction switch;
   receiving a gate voltage by the gate; and
   varying an inductance of the electron system based upon the gate voltage, the varying of the inductance inducing the resonator structure to vary a strength of coupling between the first qubit and the second qubit.

16. The method of claim 15, further comprising varying a critical current of electron system in order to vary the inductance.

17. The method of claim 15, further comprising varying the inductance in order to induce a varying of a characteristic frequency of the resonator structure.

18. The method of claim 17, wherein the varying of the characteristic frequency of the resonator structure enables the varying of the strength of coupling between the first qubit and the second qubit.

19. A superconductor fabrication system comprising a lithography component, the superconductor fabrication system when operated on a die to fabricate a superconductor device performing operations comprising:
   capacitively coupling a first end of a resonator structure to a first qubit;
   capacitively coupling a second end of the resonator structure to a second qubit;
   coupling an electron system to the resonator structure;
   positioning a gate proximal to a portion of the electron system; and
   interrupting, by the electron system and the gate, the resonator structure at one or more predetermined locations forming a Josephson junction switch, the gate configured to receive a gate voltage and vary an inductance of the electron system based upon the gate voltage, the varying of the inductance inducing the resonator structure to vary a strength of coupling between the first qubit and the second qubit.

20. The superconductor fabrication system of claim 19, wherein the varying of the inductance is a result of the gate varying a critical current of electron system.

21. The superconductor fabrication system of claim 20, wherein the varying of the inductance induces a varying of a characteristic frequency of the resonator structure.

22. The superconductor fabrication system of claim 21, wherein the varying of the characteristic frequency of the resonator structure enables the varying of the strength of coupling between the first qubit and the second qubit.

23. The superconductor fabrication system of claim 19, wherein the gate voltage is configured to vary the switch between a low inductance state with a high critical current, and a high inductance state with low critical current.

\* \* \* \* \*